(12) United States Patent
Chen et al.

(10) Patent No.: US 12,074,103 B2
(45) Date of Patent: Aug. 27, 2024

(54) CIRCUIT ASSEMBLY

(71) Applicant: AP Memory Technology Corp., Zhubei (TW)

(72) Inventors: Wenliang Chen, Zhubei (TW); Jun Gu, Zhubei (TW); Masaru Haraguchi, Tokyo (JP); Takashi Kubo, Tokyo (JP); Chien-An Yu, Zhubei (TW); Chun Yi Lin, Zhubei (TW)

(73) Assignee: AP Memory Technology Corp., Zhubei (TW)

( * ) Notice: Subject to any disclaimer, the term of this patent is extended or adjusted under 35 U.S.C. 154(b) by 0 days.

(21) Appl. No.: 17/830,191

(22) Filed: Jun. 1, 2022

(65) Prior Publication Data
US 2022/0302021 A1   Sep. 22, 2022

Related U.S. Application Data

(60) Division of application No. 17/010,517, filed on Sep. 2, 2020, now Pat. No. 11,380,614, which is a
(Continued)

(51) Int. Cl.
*H01L 23/522* (2006.01)
*H01L 23/48* (2006.01)
(Continued)

(52) U.S. Cl.
CPC ........ *H01L 23/5223* (2013.01); *H01L 23/481* (2013.01); *H01L 23/5329* (2013.01); *H10B 12/30* (2023.02); *H01L 23/40* (2013.01)

(58) Field of Classification Search
CPC ........ H01L 23/00; H01L 23/40; H01L 23/48; H01L 23/481; H01L 23/522; H01L 23/532; H01L 23/5223; H01L 23/5329; H01L 25/16; H01L 25/18; H01L 24/08; H01L 24/80; H01L 2224/131; H01L 2224/0401;
(Continued)

(56) References Cited

U.S. PATENT DOCUMENTS

| 5,939,782 A | 8/1999 | Malladi |
| 7,602,002 B2 | 10/2009 | Inoue et al. |

(Continued)

FOREIGN PATENT DOCUMENTS

| WO | 2018198330 A1 | 11/2018 |
| WO | 2020/005333 A1 | 1/2020 |

OTHER PUBLICATIONS

Roozeboom et. al., "Ultrahigh-density (> µ0.4 F/mm2) trench capacitors in silicon", First Int. Workshop on Power Supply on Chip (PowerSoC08), Cork, Ireland, Sep. 22-24, 2008.
(Continued)

*Primary Examiner* — Chuong A Luu
(74) *Attorney, Agent, or Firm* — Chen Yoshimura LLP

(57) ABSTRACT

A circuit assembly includes an integrated circuit (IC) die and a capacitor die. The IC die has a first hybrid bonding layer. The capacitor die is stacked with the IC die, and is configured to include a capacitor coupled to the IC die, and has a second hybrid bonding layer in contact with the first hybrid bonding layer; wherein the IC die is electrically coupled to the capacitor die through the first hybrid bonding layer and the second hybrid bonding layer.

19 Claims, 16 Drawing Sheets

Related U.S. Application Data continuation-in-part of application No. 16/232,417, filed on Dec. 26, 2018, now Pat. No. 10,811,402.

(60) Provisional application No. 62/895,467, filed on Sep. 3, 2019.

(51) Int. Cl.
*H01L 23/532* (2006.01)
*H10B 12/00* (2023.01)
*H01L 23/40* (2006.01)

(58) Field of Classification Search
CPC . H01L 2224/05096; H01L 2224/05099; H01L 2224/05568; H01L 2224/05599; H01L 2224/09181; H01L 2224/13023; H01L 2224/73251; H01L 2224/80357; H01L 2224/80895; H01L 2224/9202; H01L 2224/08267; H01L 2224/80896; H10B 12/00; H10B 12/30
USPC .......................................................... 257/666
See application file for complete search history.

(56) References Cited

U.S. PATENT DOCUMENTS

| | | |
|---|---|---|
| 8,845,854 B2 | 9/2014 | El et al. |
| 9,130,057 B1 | 9/2015 | Kumar et al. |
| 9,230,941 B2 | 1/2016 | Chen et al. |
| 9,502,434 B2 | 11/2016 | Tanaka et al. |
| 10,510,634 B2 | 12/2019 | Lin et al. |
| 10,600,781 B1 | 3/2020 | Xiao et al. |
| 2006/0131738 A1* | 6/2006 | Furman ............... H01L 23/3737 257/E23.087 |
| 2008/0203443 A1 | 8/2008 | Wilson et al. |
| 2015/0318246 A1 | 11/2015 | Yu et al. |
| 2015/0339201 A1 | 11/2015 | Kanekawa et al. |
| 2016/0012865 A1 | 1/2016 | Lee et al. |
| 2016/0155722 A1 | 6/2016 | Leedy |
| 2016/0336990 A1 | 11/2016 | Petzold et al. |
| 2016/0358865 A1 | 12/2016 | Shih et al. |
| 2017/0125436 A1 | 5/2017 | Sharangpani et al. |
| 2018/0190583 A1* | 7/2018 | DeLaCruz ............... H01L 24/05 |
| 2019/0044764 A1 | 2/2019 | Hollis et al. |
| 2019/0138412 A1 | 5/2019 | Ogasawara |
| 2019/0304935 A1 | 10/2019 | Collins et al. |
| 2020/0066668 A1 | 2/2020 | Umemoto |
| 2020/0075534 A1 | 3/2020 | Gao et al. |
| 2020/0098853 A1 | 3/2020 | Haraguchi et al. |
| 2020/0103361 A1 | 4/2020 | Wieczorek |
| 2020/0227366 A1 | 7/2020 | Dogiamis et al. |
| 2020/0243455 A1 | 7/2020 | Wang et al. |
| 2021/0134747 A1 | 5/2021 | Yang |
| 2021/0242189 A1 | 8/2021 | Or-Bach et al. |
| 2021/0280540 A1* | 9/2021 | Kim ..................... H01L 25/105 |

OTHER PUBLICATIONS

Baker, "Benefits of Stacked-Wafer Capacitors for High-Frequency Buck Converters", Power SoC, Northeastern University, Boston, MA, Oct. 7, 2014.

Murata Manufacturing Co., Ltd., "3D Silicon Capacitors", CATSICAP1. 5, Feb. 24, 2020. Available at https://www.murata.com/-/media/webrenewal/products/capacitor/siliconcapacitors/pdf/silicon-capacitors- cataloguev15murata.pdf.

Taiwanese Office Action, dated Oct. 29, 2021, in a counterpart Taiwanese patent application, No. TW 110113790. (Concise Summary of Taiwanese Office Communication and English translation of the search report are appended after the Chinese language document in the same PDF.).

* cited by examiner

CIRCUIT ASSEMBLY

PRIORITY CLAIM AND CROSS-REFERENCE

This application is a Divisional of co-pending U.S. patent application Ser. No. 17/010,517, filed Sep. 2, 2020, which is a continuation-in-part of pending U.S. application Ser. No. 16/232,417, filed Dec. 26, 2018, the entire contents of which is incorporated herein by reference.

This application claims the benefit of U.S. Provisional Application No. 62/895,467, filed Sep. 3, 2019, the disclosure of which is hereby incorporated by reference in its entirety.

FIELD OF THE INVENTION

The present invention generally relates to a circuit assembly. Specifically, the present invention generally relates to a circuit assembly comprising a plurality of dies.

BACKGROUND OF THE INVENTION

In electronic systems, capacitors may be commonly used to reduce power supply fluctuation or to construct power converters. As the complexity of electronic systems rapidly evolves and the performance requested from the market vividly grows, capacitors in the form of integrated passive devices (IPDs) are widely used to fulfill the requirements, such as great amount, high capacitance, low ESL (Equivalent Series Inductance) and ESR (Equivalent Series Resistance), etc. It may be difficult to integrate all the capacitors along with other circuit in a circuit assembly.

SUMMARY OF THE INVENTION

One aspect of the present invention is to provide a novel structure of a circuit assembly integrating both capacitors and an integrated circuit which may be powered and receive signals to operate with the capacitors through electrical connections between conductive pads.

Another aspect of the present invention is to provide an integrated circuit numerous of IPD capacitors as decoupling capacitors with high capacitance value and/or excellent ESR/ESL to achieve high performance computing but avoiding from wire bonding or solder mounting.

Yet, another aspect of the present invention is to provide an integrated circuit numerous of IPD capacitors as flying capacitor of a convertor serving an internal power.

According to an embodiment of the invention, a circuit assembly is provided. The circuit assembly comprises an IC die and a capacitor die. The IC die has a first hybrid bonding layer. The capacitor die is stacked with the IC die, and is configured to include a capacitor coupled to the IC die, and has a second hybrid bonding layer in contact with the first hybrid bonding layer. The IC die is electrically coupled to the capacitor die through the first hybrid bonding layer and the second hybrid bonding layer.

According to another embodiment of the invention, a circuit assembly is provided. The circuit assembly comprises an IC die and a stack of capacitor dies. The IC die has a first hybrid bonding layer. The stack of capacitor dies are stacked over the IC die, and are configured to include a capacitor coupled to the IC die. The stack of capacitor dies comprise: a first capacitor die having a second hybrid bonding layer in contact with the first hybrid bonding layer; and a second capacitor die stacked over the first capacitor die, the first capacitor die having a third hybrid bonding layer, and the second capacitor die having a fourth hybrid bonding layer in contact with the third hybrid bonding layer.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons of ordinary skill in the art having the benefit of the present disclosure will understand other variations for implementing embodiments within the scope of the present disclosure, including those specific examples described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

Figure 1:
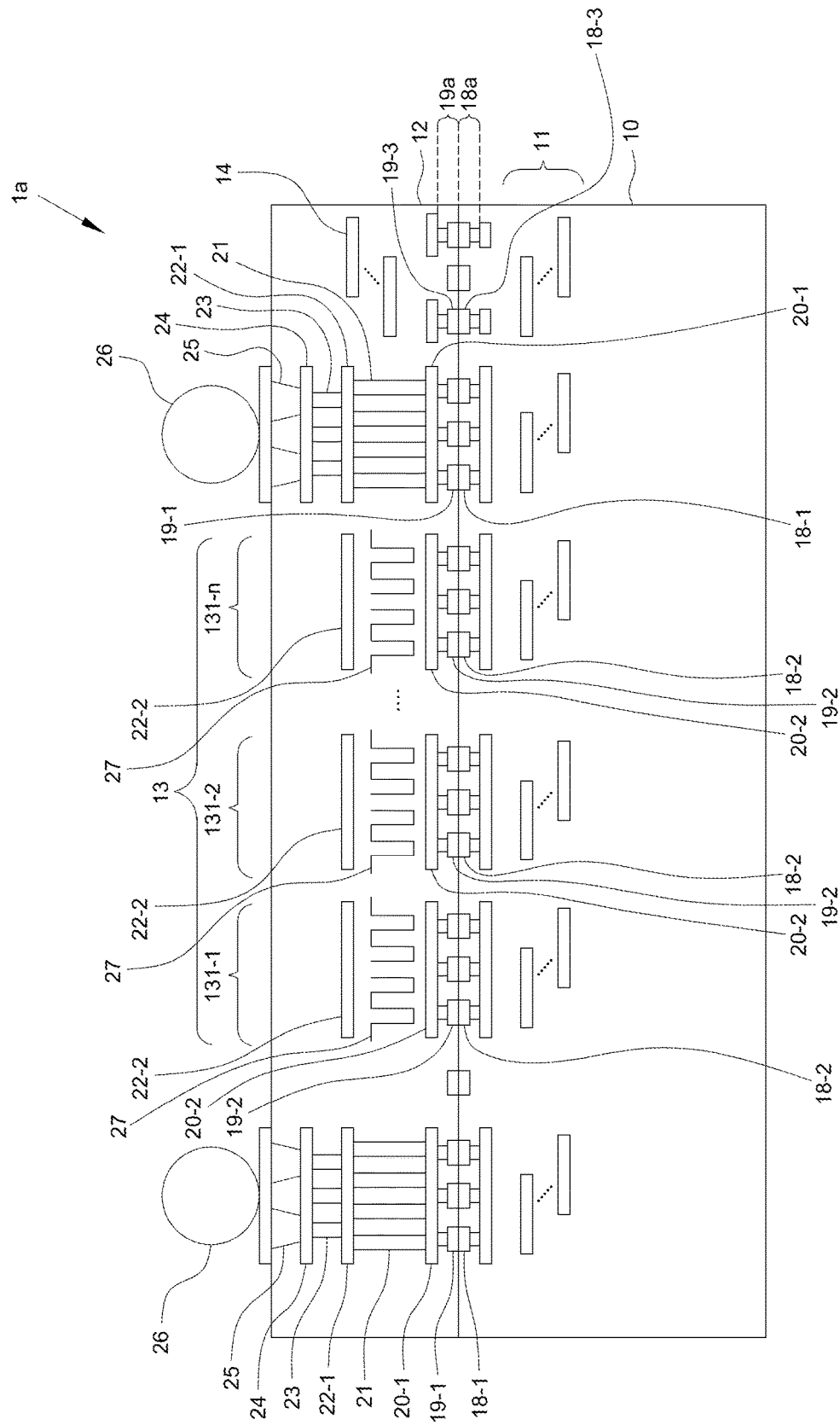
FIG. 1 shows schematic diagrams of a cross-sectional view of an implementation of a circuit assembly illustrating according to a first embodiment of the invention.

FIG. 1 is a cross-sectional view of an implementation of a circuit assembly 1a according to a first embodiment of the invention. Please note the structure, type, size, material, etc. of the circuit assembly may be varied according to the requirements of a specific application. Here, an example layered structure of the circuit assembly 1a is shown. The circuit assembly 1a may comprise an integrated circuit (IC) die 10 comprising an IC 11 and a capacitor die 12 comprising a capacitor block 13 constructed by a plurality of capacitors 131-1, 131-2, 131-n. According to the present embodiment, the capacitor die 12 may be configured to comprise active devices formed in the semiconductor substrate of the capacitor die 12. For example, in this embodiment, a memory (e.g. the numeral 14 in FIG. 1) and/or a voltage regulator (e.g. the numeral 15 in FIG. 2) may be optionally embedded in the capacitor die 12. The voltage regulator (e.g. the numeral 15 in FIG. 3) may also be optionally embedded in the IC die 10. The memory may be a Dynamic Random Access Memory (DRAM). The voltage regulator may be a switched capacitor voltage regulator circuit. The IC die 10 has a first hybrid bonding layer 101, and the capacitor die 102 has a second hybrid bonding layer 102. The IC die 10 may be stacked with the capacitor die 12 by contacting the first hybrid bonding layer 18a and the second hybrid bonding layer 19a. The IC die 10 is electrically coupled to the capacitor die 12 through the first hybrid bonding layer 18a and the second hybrid bonding layer 19a. The capacitors 131-1, 131-2, 131-n are stacked capacitor for example. The capacitor die 12 may have a first side and a second side opposite to the first side, the hybrid bonding layer 18a having a plurality of first conductive pads 18-1, 18-2, 18-3, 18-4 electrically connecting to the IC 11 is in contact with the first side, and a plurality of conductive vias 25 are provided at the second side. Here, the first side may be a front side and the second side may be a back side for example. On a back side of the capacitor die 12, a plurality of metal bumps 26 are formed. On a front side of the capacitor die 12, the hybrid bonding layer 19a having a plurality of second conductive pads 19-1, 19-2, 19-3, 19-4 is provided. The first conductive pads 18-1, 18-2, 18-3, 18-4 may physically contact with the second conductive pads 19-1, 19-2, 19-3, 19-4 in one-on-one manner allowing signal transmission between the IC die 10 and the capacitor die 12. The first conductive pads 18-1, 18-2, 18-3, 18-4 and the second conductive pads 19-1, 19-2, 19-3, 19-4 are laterally surrounded by dielectric material, for example, oxide materials. The first and second conductive pads 18-1, 19-1 may be provided for external signal transmission, and preferably, the second conductive pads 19-1 may electrically connect to the first conductive pads 18-1 and a top metal layer 20-1 of the capacitor die 12, and then to the conductive vias 25 and the interface bumps 26 through the electrical connection built by layers of conductive vias 21, 23 and metal layer(s) 22-1, 24. Each of the conductive vias 21, 23, and 25 may be implemented as through silicon vias (TSV). Therefore, the conductive vias 21, 23 and 25 are adapted to form an external signal connection of the IC die 10 and the capacitor die 12. The electrical connection (i.e. the external signal connection) from the first conductive pads 18-1 to the interface bumps 26 may form transmission channels to transmit external signals and receive external power into the IC die 10 and output signals of the IC die 10 to an external device. The metal layer 24 may be the bottom-most metal layer of the capacitor die 12. The number of layers of conductive vias 21, 23 and metal layer(s) 22-1, 24 may be varied. The conductive vias 25 may be implemented as through silicon vias (TSV) an end of which electrically connects to the bottom-most metal layer 24 and the other end of which electrically connects to one of the interface bumps 26 which may be metal bumps. Preferably, the capacitor die 12 may be polished before the formation of the TSV and a thickness of the capacitor die 12 may be less than 10 μm. The first and second conductive pads 18-2, 19-2 may be provided as capacitor contacts transmitting charges flow into/from the capacitors 131-1, 131-2, 131-n, and preferably the second conductive pads 19-2 may electrically connect to the first conductive pads 18-2 and one of two electrodes 20-2 of the capacitors 131-1, 131-2, 131-n which may be of the same layer as the top metal layer 20-1. The other electrode 22-2 of the capacitors 131-1, 131-2, 131-n may be of the same layer as the metal layer 22-1. Between the two layers of electrodes 20-2, 22-2, at least one dielectric layer 27 which may comprise at least one layer of insulating material, high dielectric material, nitride film, etc. may be formed to increase capacitance of the capacitors 131-1, 131-2, 131-n. For example, the capacitor die 12 may provide 800 μF of capacitance for the IC die 10 by more than 1 million second conductive pads 19-2. A large number of second conductive pads 19-2 may reduce ESR and ESL to zero substantially. The structure, material, size, shape of the dielectric layer 27 may be changed to reach desired characters. Through the electrical connection between the first and second conductive pads 18-2, 19-2, charges may be flow into the capacitors 131-1, 131-2, 131-n from the IC 11 or from the capacitors 131-1, 131-2, 131-n to the IC 11. However, this is not the limitation of the present invention. The capacitor die 12 may comprise deep trench capacitors in the semiconductor substrate of the capacitor die 12, or metal-insulator-metal (MIM) stack capacitors in a plurality of interconnect conductive layers of the capacitor die 12, or capacitors in a form of integrated passive device (IPD), or capacitors of memory cells.

In FIG. 1, the first and second conductive pads 18-3, 19-3 may be provided as memory pads transmitting data stored or for storing in the memory 14, and preferably the second conductive pads 19-3 may electrically connect to the first conductive pads 18-3 and the memory cells of the memory 14. The memory 14 may comprise a plurality of memory components (not shown), such as memory cells to store/retain electrical information, grouped into a plurality of memory blocks. The size of storage space of the memory 14 may be varied according to the requirements of a specific application. In the present embodiment, the memory components, each of which may be DRAM (Dynamic Random Access Memory) cell which may be formed together with the capacitors 131-1, 131-2, 131-n under the same semiconductor manufacturing process. Through the electrical connection between the first and second conductive pads 18-3, 19-3, the IC 11 may access the memory 14 for data storage.

Figure 2:
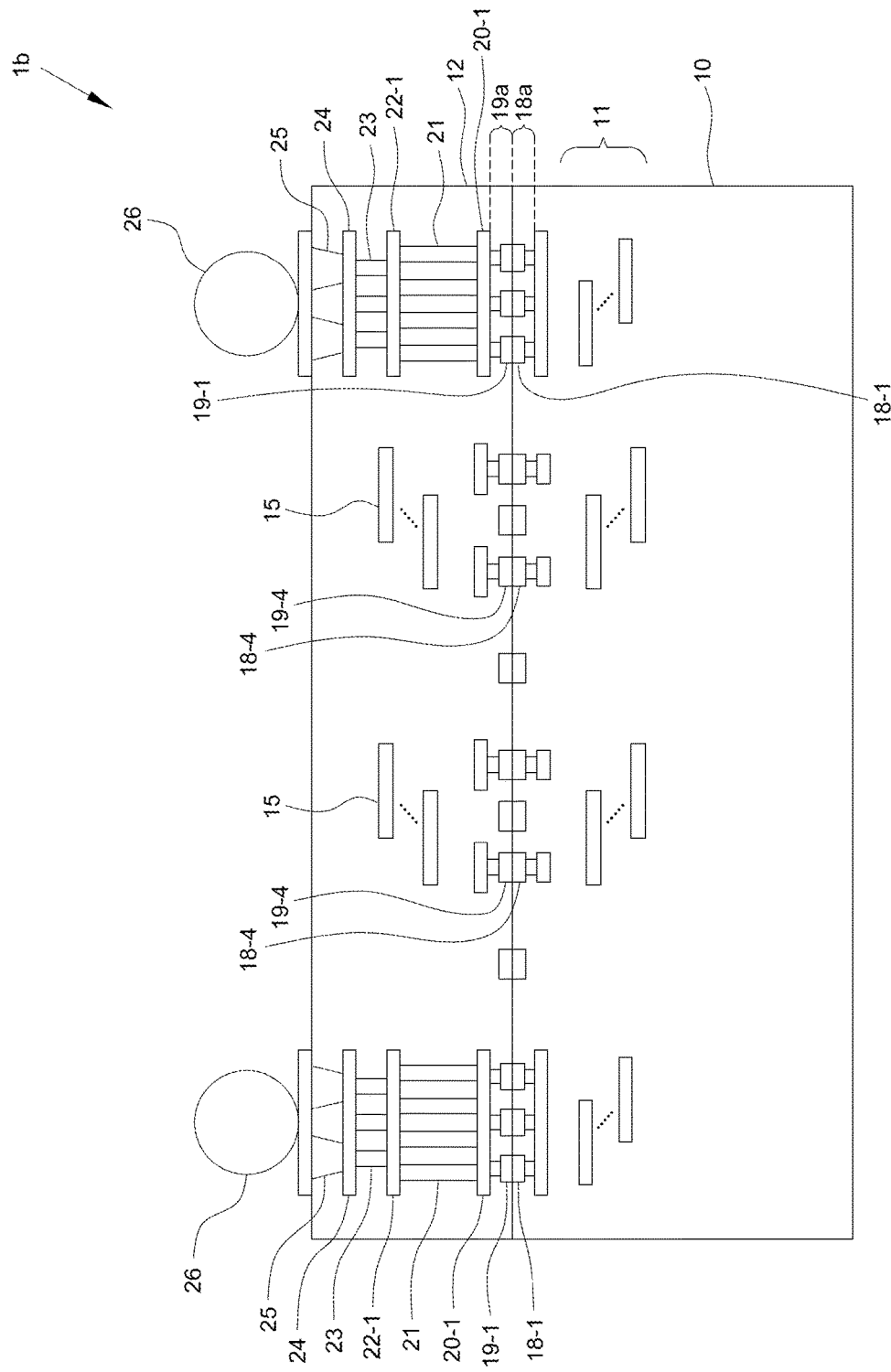
FIG. 2 shows schematic diagrams of a cross-sectional view of an implementation of a circuit assembly illustrating according to a second embodiment of the invention.
Figure 3:
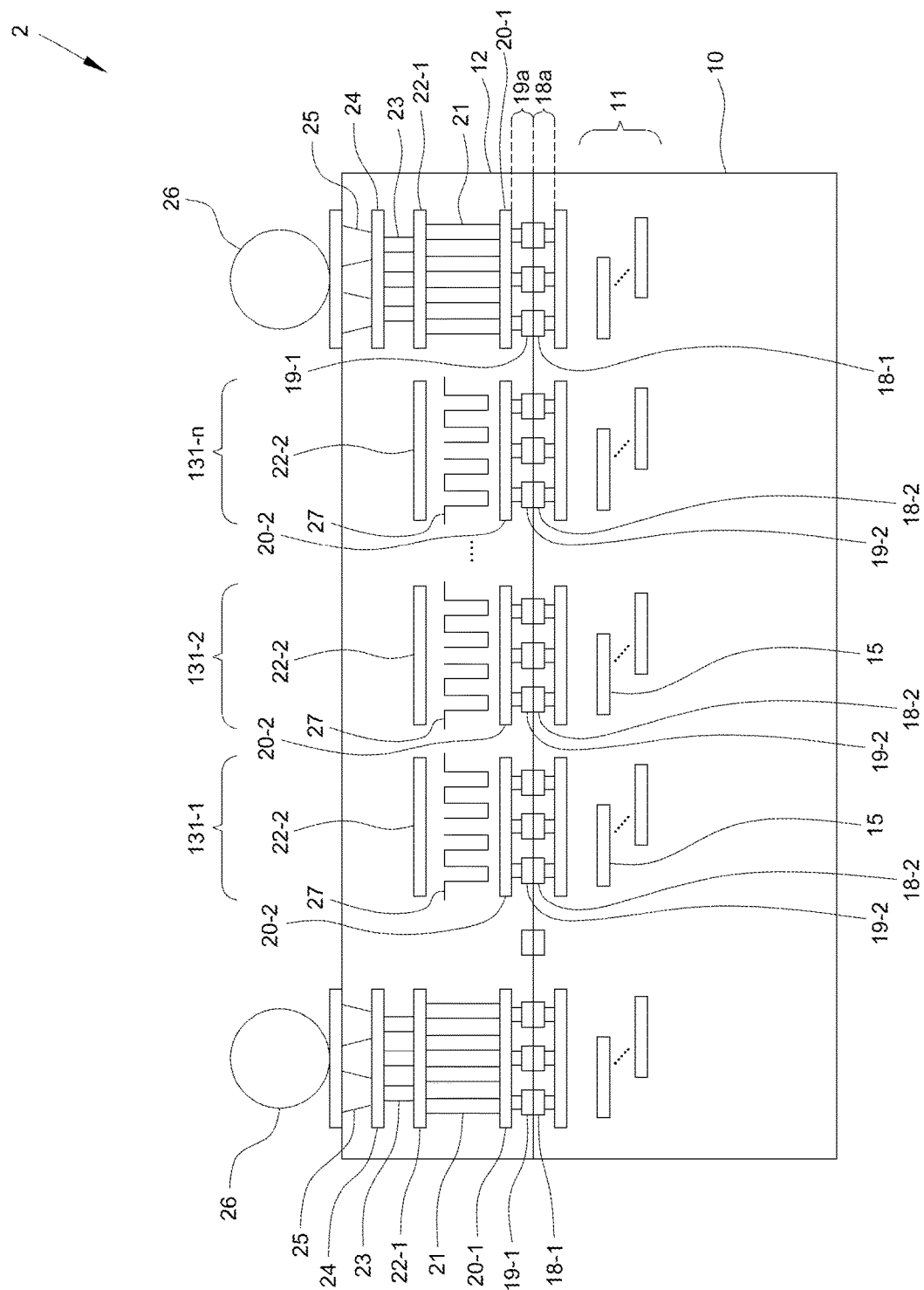
FIG. 3 shows a schematic diagram of a cross-sectional view of an implementation of a circuit assembly according to a third embodiment of the invention.

The first and second conductive pads 18-4, 19-4 may be provided for internal reference voltages or regulated voltages, and preferably the second conductive pads 19-4 may electrically connect to the first conductive pads 18-4 and the voltage regulator 15. FIG. 2 is a cross-sectional view of an implementation of a circuit assembly 1b according to a second embodiment of the invention. The layered structure of the circuit assembly 1b is similar to the circuit assembly 1a, thus the detailed description is omitted here for brevity. In the circuit assembly 1b of the present embodiment, the voltage regulator 15 is positioned at the capacitor die 12. FIG. 3 shows a schematic diagram of a cross-sectional view of an implementation of a circuit assembly 2 according to a third embodiment of the invention. The layered structure of the circuit assembly 2 is similar to the circuit assembly 1a, thus the detailed description is omitted here for brevity. In the circuit assembly 2 of the present embodiment, the voltage regulator 15 is positioned at the IC die. The IC die together with the capacitor die may construct a switched capacitor type voltage regulator (e.g. the numeral 16 in FIG. 14).

Figure 4:
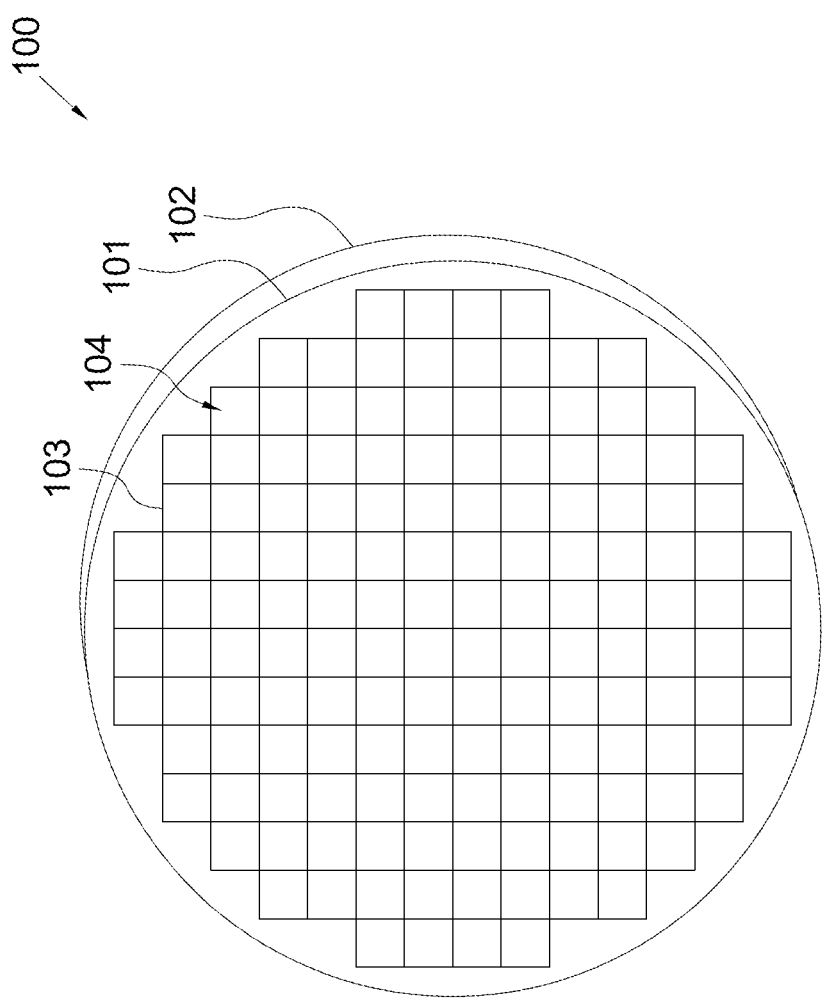
FIG. 4 shows a perspective view of a wafer for manufacturing a circuit assembly of an embodiment of the present invention.
Figure 5:
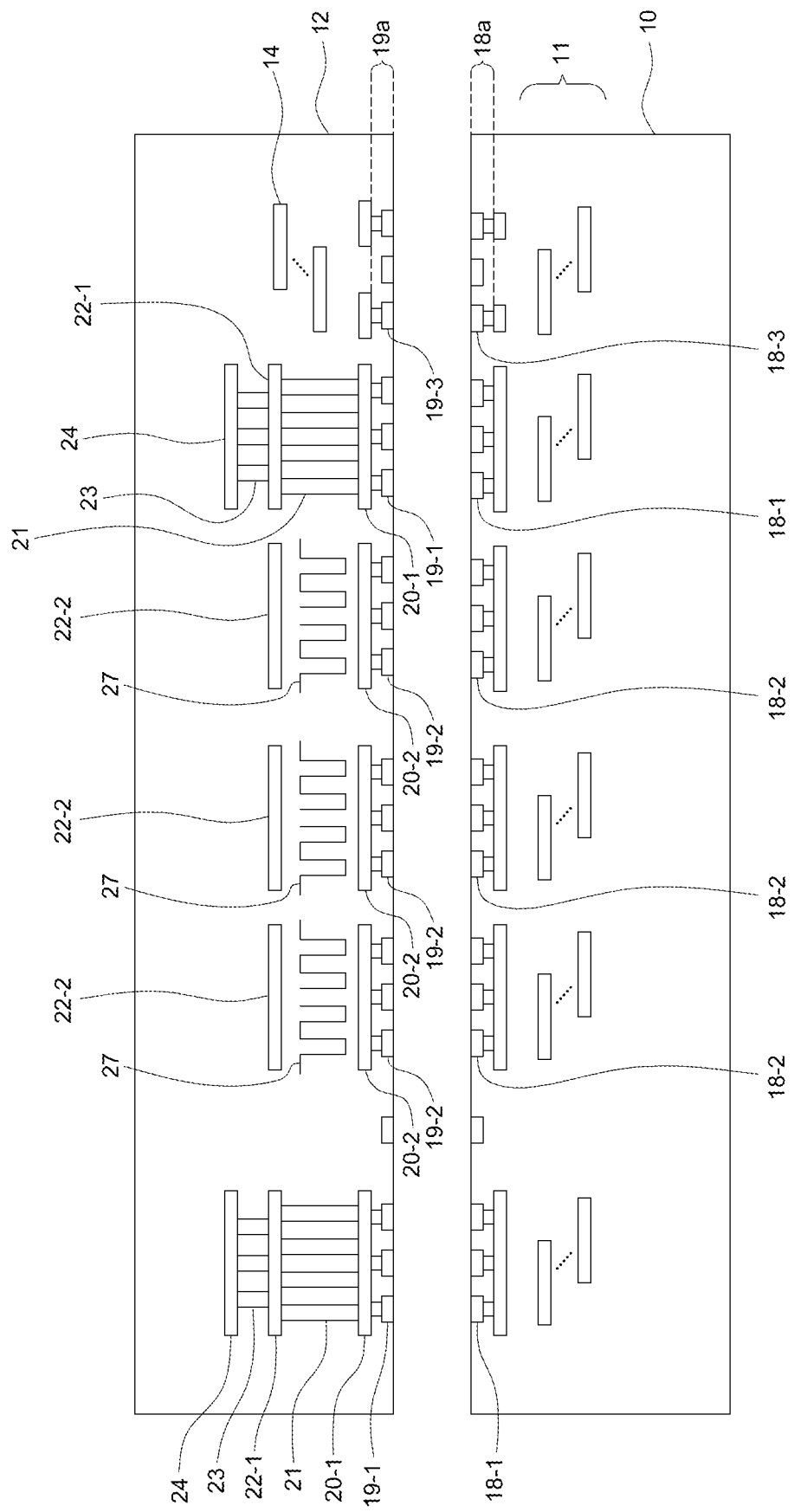
FIGS. 5 to 8 show a perspective view of wafers for manufacturing a circuit assembly of an embodiment of the present invention.

Please refer to FIG. 4 for a perspective view of a wafer for manufacturing a circuit assembly (e.g. the circuit assembly 1a) of an embodiment of the present invention. The wafer 100, for example made from silicon, glass or the like, may present a front-side surface 101 facing a front side and a back-side surface 102 facing a back side. A plurality of repetitive regions 104 divided by a plurality of scribe lines 13 are presented. The number of the repetitive regions 104 and scribe lines 103 may be varied. In each repetitive region 104, a complex layered circuit may be formed in a vicinity to a front-side surface 101 of the wafer 100. An upper wafer 100 for manufacturing the IC die 10 and a lower wafer 100 for manufacturing the capacitor die 12 may be prepared as shown in FIG. 5. The complex layered circuit of the upper wafer 100 may be constructed by a dielectric layer 27 and a plurality of interconnect conductive layers comprising but not limited to a top metal layer 20-1, a metal layer 22-1, a bottom-most metal layer 24 and two layers of electrodes 20-2, 22-2, and the complex layered circuit of the lower wafer 100 may be constructed by a plurality of interconnect conductive layers comprising but not limited to a top metal layer 20-1, a metal layer 22-1, and a bottom-most metal layer 24. In some embodiments, other layers may be formed in either wafer; for example, a plurality of insulation layers may be formed to separate the interconnect conductive layers.

Figure 9:
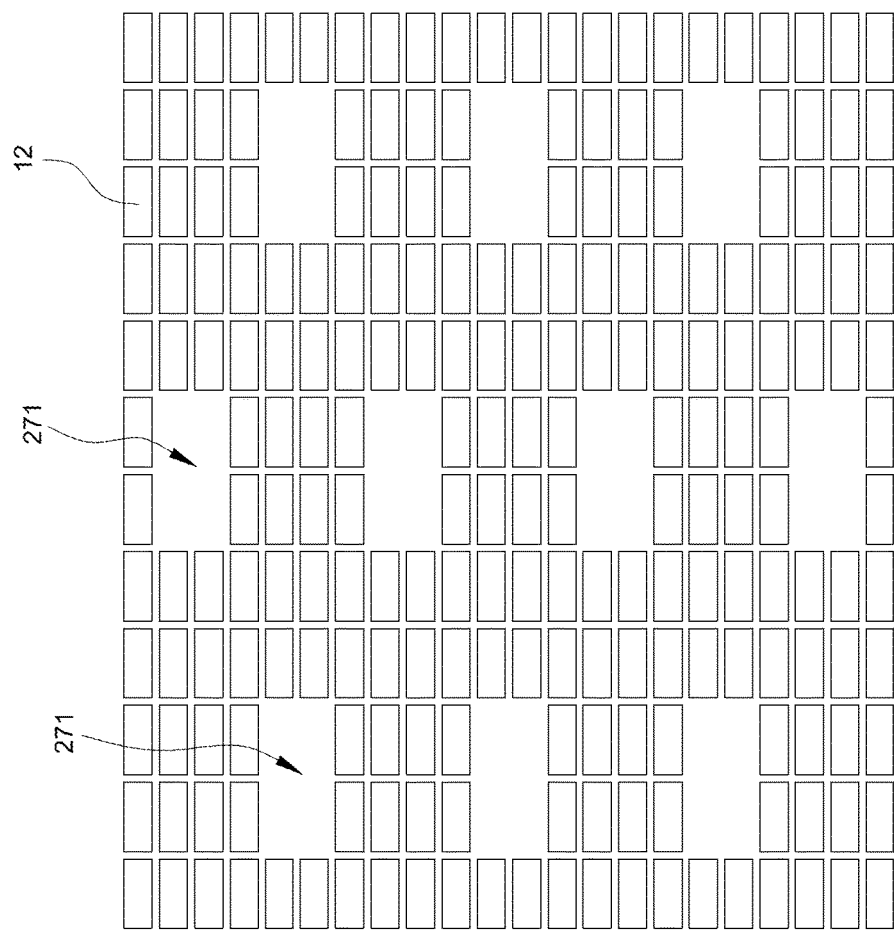
FIG. 9 shows a top view of an example configuration of the capacitor die of a circuit assembly of an embodiment of the present invention.

Referring to FIG. 9, a top view of an example configuration of the capacitor die 12 is shown. In the capacitor die 12, a plurality of keep-out zones 271 deploying the conductive vias 25 are defined. The keep-out zones 271 may allow for the formation of the conductive vias 21, which may eventually electrically connect to the conductive vias 25 and the interface bumps 26. In other words, the keep-out zones 271 are defined for forming the external signal connections of the capacitor die 12 and/or the IC die 10.

Back to FIG. 5, on the front-side surface 101 of the two wafers 100, the plurality of first and the second conductive pads 18-1, 18-2, 18-3, 18-4 of the hybrid bonding layer 18a and 19-1, 19-2, 19-3, 19-4 of the hybrid bonding layer 19a may be formed. The number, shape, size and arrangement of the first and the second conductive pads 18-1, 18-2, 18-3, 18-4 and 19-1, 19-2, 19-3, 19-4 may be changed. Here, the first and the second conductive pads 18-1, 18-2, 18-3, 18-4 and 19-1, 19-2, 19-3, 19-4 may be implemented by metal contacts for connecting each other with wafer-on-wafer bonding technology. Preferably, the first and the second conductive pads 18-1, 18-2, 18-3, 18-4 and 19-1, 19-2, 19-3, 19-4 may be of a pitch less than 3 μm.

Figure 6:
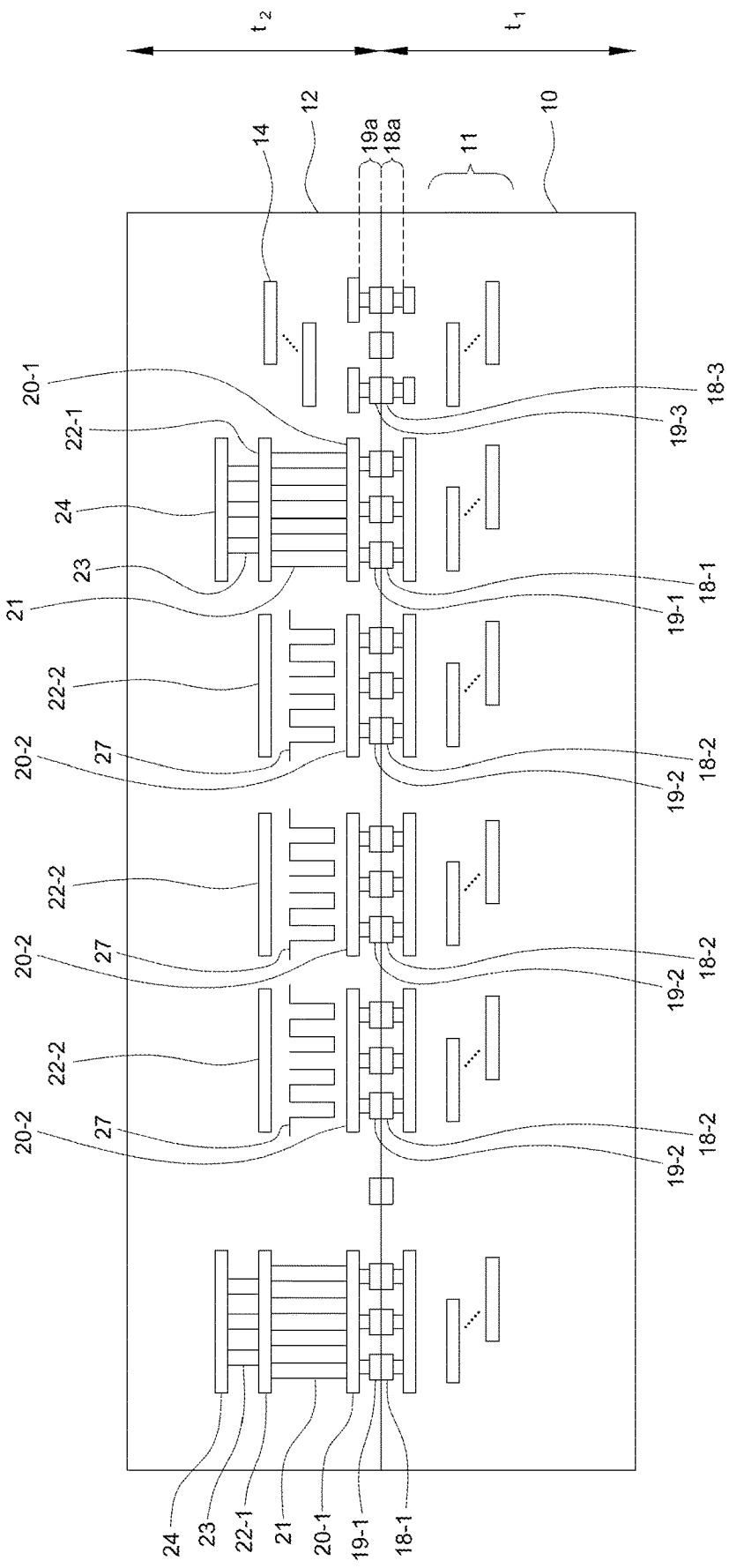

As shown in FIG. 6, after a wafer-on-wafer bonding process, the two wafers 100 are bounded. Here, a front-to-front stacking hybrid bonding to stack the hybrid bonding layers 18a and 19a of the two wafers 100 vertically is performed for example. This means the front-side surfaces 101 of the wafers 100 face to each other, and preferably, the scribe lines 103 of the wafers 100 may be fully overlapped with each other.

Figure 7:
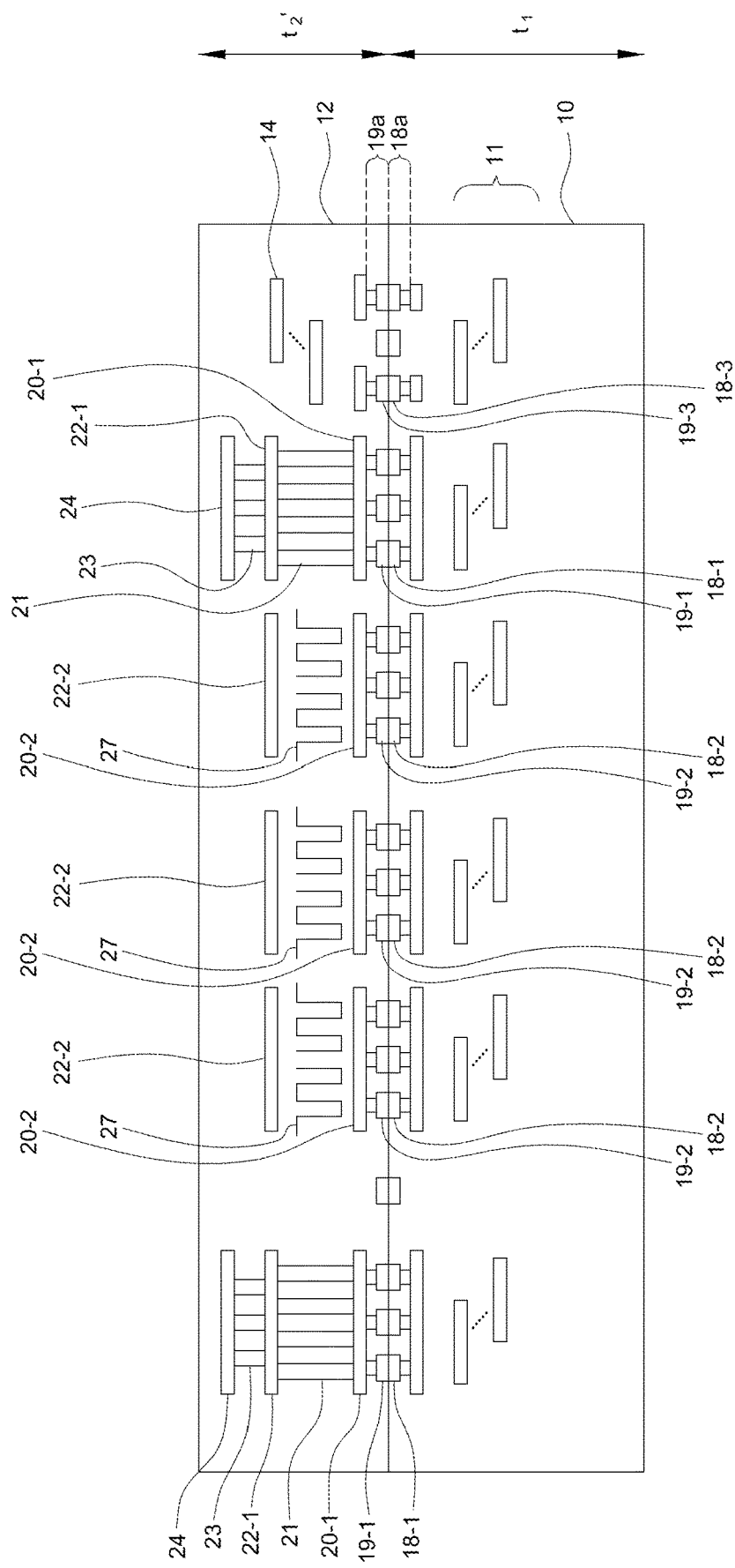

Then, as shown in FIG. 7, the thickness of the wafer 100 for manufacturing the capacitor die 12 may be reduced from $t_2$ (shown in FIG. 6) to $t'_2$, thinner than the thickness of the other wafer 100 for manufacturing the IC die 10, $t_1$, with chemical mechanical planarization (CMP) process or etched with dry or wet etching. Preferably, when the polishing is done, the thickness above the bottom-most metal layer 24 of the wafer 100 for manufacturing the capacitor die 12 may be within 10 μm.

Figure 8:
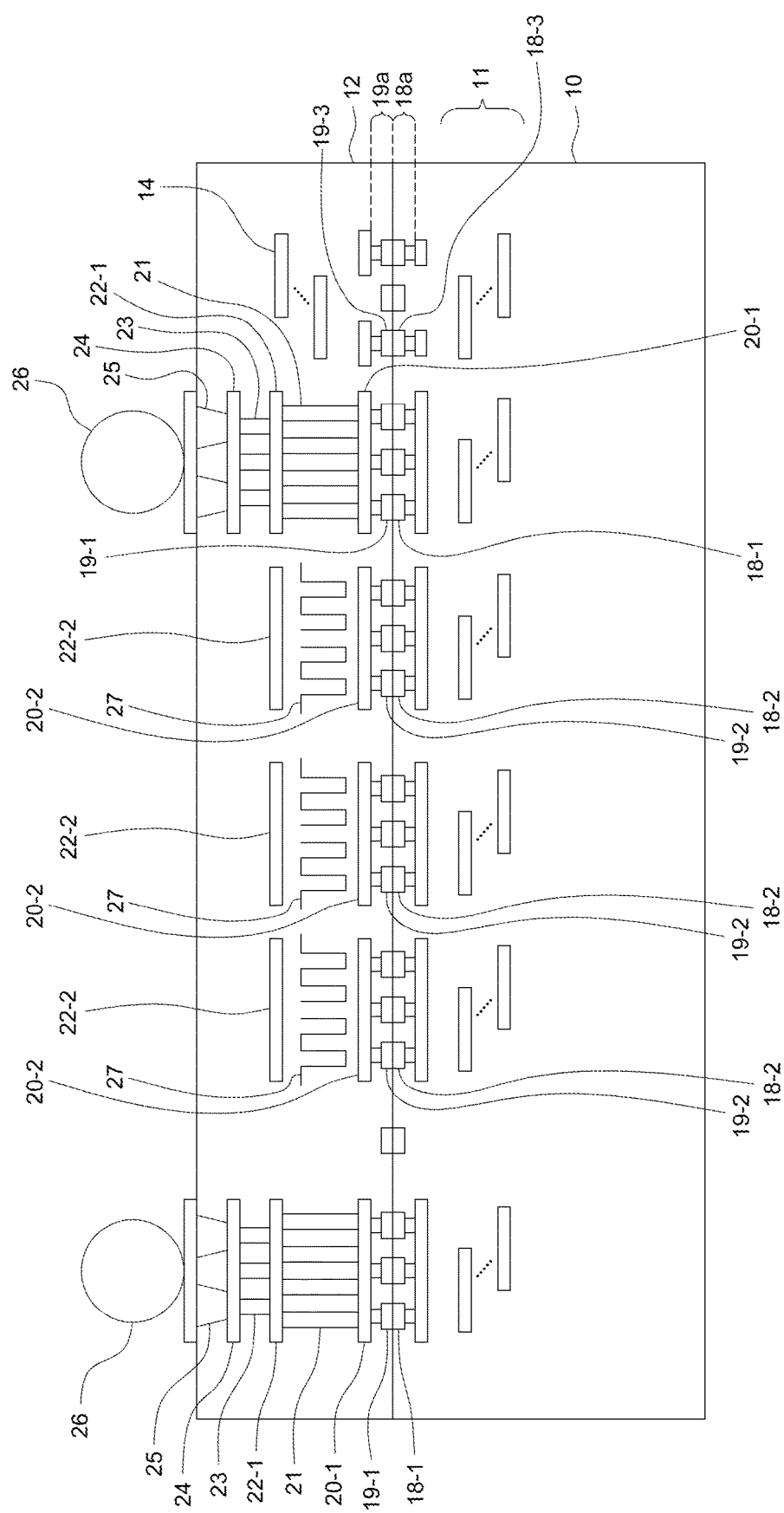

Then, as shown in FIG. 8, a plurality of conductive vias 25 and interface bumps 26 transmitting input/output signals to or from the circuit assembly 1a and receive external supply power are formed from the back-side surface 102 of the wafer 100 for manufacturing the capacitor die 12. Here, an end of the conductive vias 25 may electrically connect to but not limited to one of the interconnect conductive layers of the capacitor die 12, such as the bottom-most metal layer 24, and the other end of the conductive vias 25 may electrically connect to the interface bumps 26. Then, the bounded wafers 100 may be cut along the overlapped scribe lines 103, and each bounded repetitive regions 14, stacked vertically, corresponds to a circuit assembly. Therefore, surfaces of the IC die 10 and the capacitor die 12, comprising those corresponding to the front-side and back-side surfaces 101, 102 of the wafers 100, attaching to each other are substantially of the same size, which may be called die size. Preferably, the die size may be 100 to 800 mm². In the present embodiment, benefit from the electrical connection between the first and second conductive pads 18-1, 19-1 transmitting input/output signals and external power into/from the IC die 10, an optional heatsink (not shown) may be attached to a side of the IC die 10, opposite to that the first conductive pads 18-1 are positioned at, to promote heat dissipation. Preferably, the heatsink may be mounted on a back side of the IC die 10.

Figure 10:
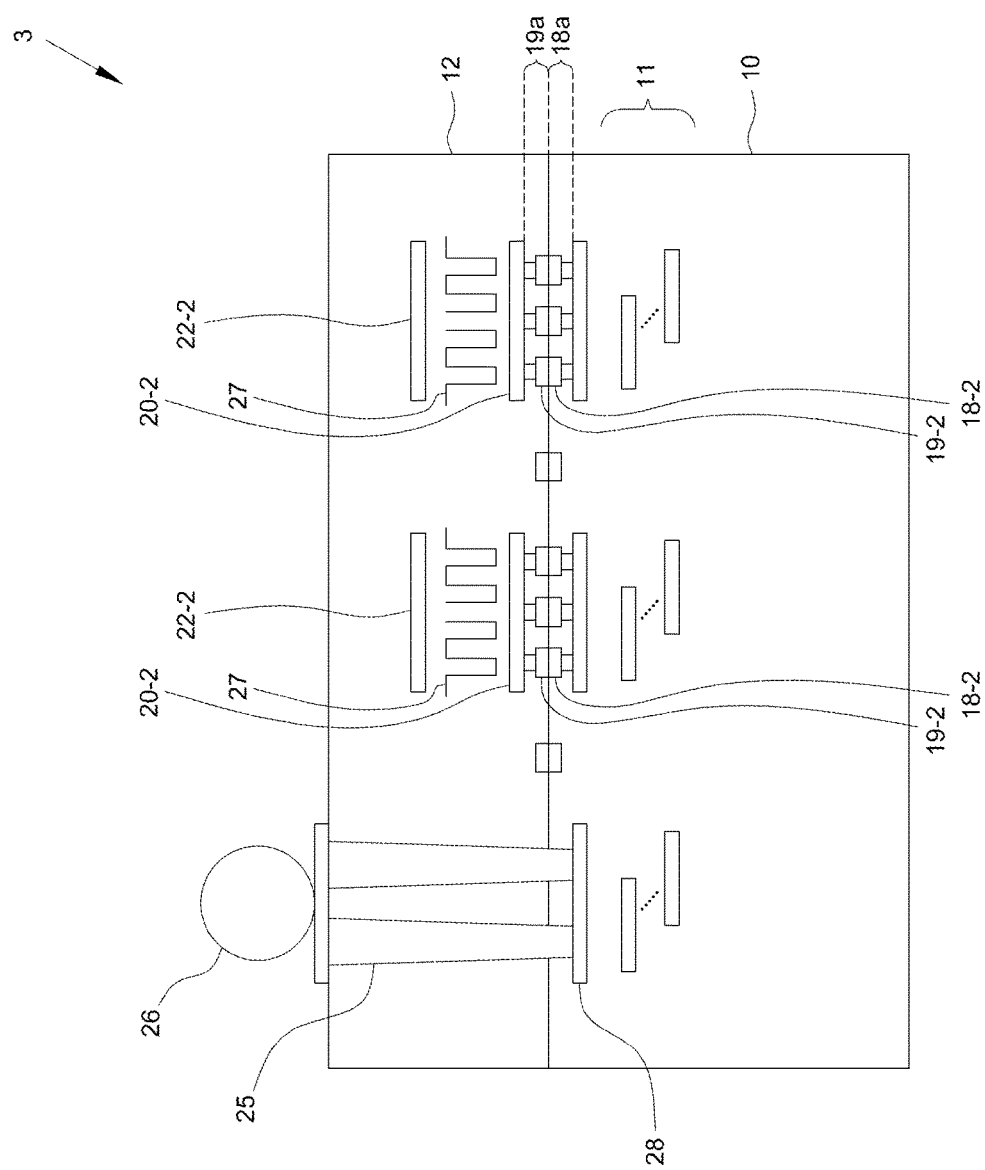
FIG. 10 shows a schematic diagram of a cross-sectional view of a circuit assembly according to a fourth embodiment of the invention.

Please refer to FIG. 10 which shows a schematic diagram of a cross-sectional view of a circuit assembly according to a fourth embodiment of the invention. In a circuit assembly 3 of the present embodiment, a plurality of conductive vias 25 are formed in the way that an end of the conductive vias 25 contacts with one of the interconnect conductive layers, such as a top metal layer 28 of an IC 11 of an IC die 10, and another end of the conductive vias 25 electrically connects to one of interface bumps 26 landing on the back-side surface of the wafer for manufacturing the capacitor die 12 to transmit input/output signals to or from the circuit assembly 3 and receive external supply power.

Figure 11:
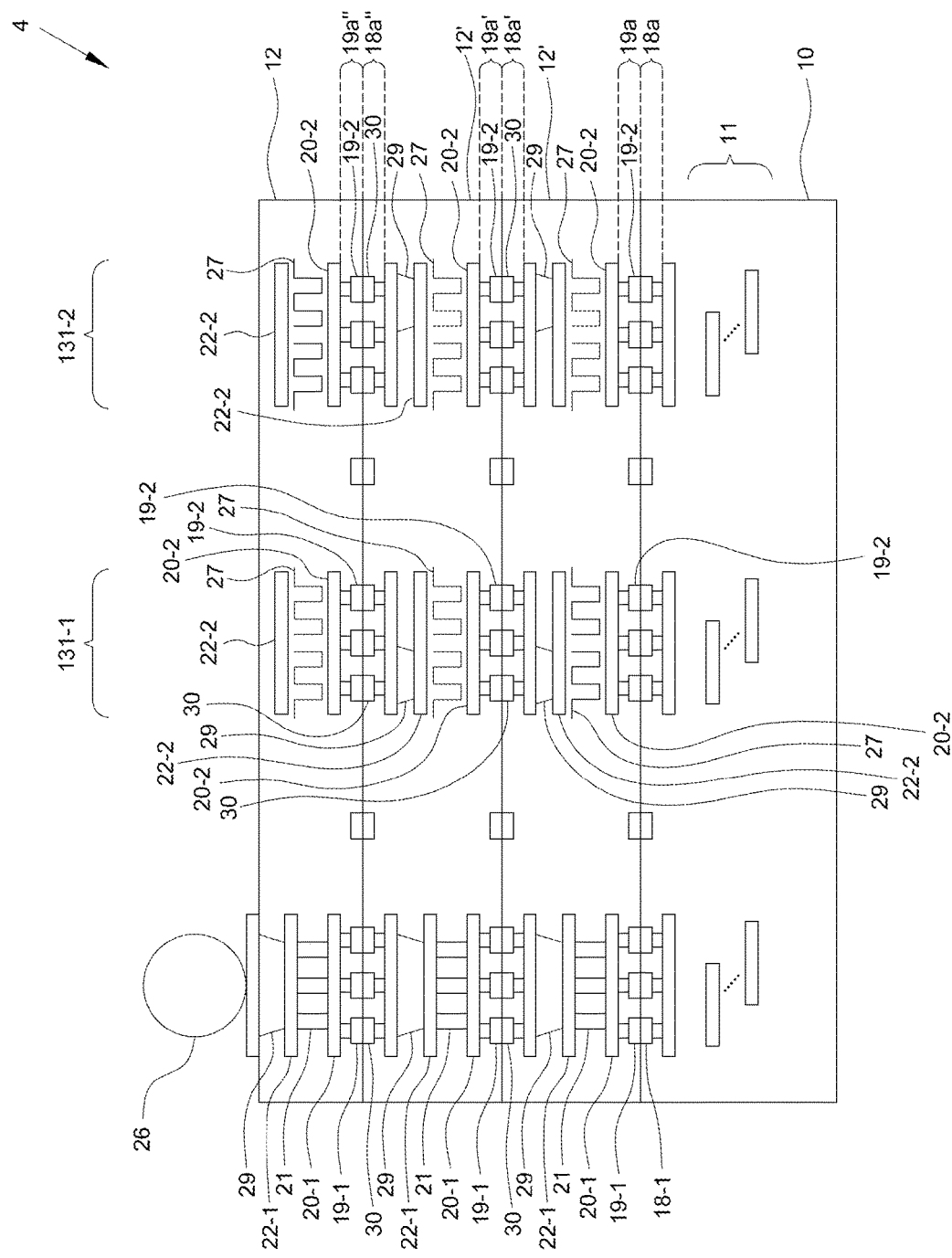
FIG. 11 shows a schematic diagram of a cross-sectional view of a circuit assembly according to a fifth embodiment of the invention.

Please refer to FIG. 11 which shows a schematic diagram of a cross-sectional view of a circuit assembly according to a fifth embodiment of the invention. Compared with the first embodiment, a stacked of capacitor dies 12' are stacked between a capacitor die 12 and an IC die 10 in a circuit assembly 4 of the present embodiment. In this embodiment, the first capacitor die 12' is the lower capacitor die in contact with the IC die 10, the second capacitor die 12' is the middle capacitor die disposed between the lower capacitor die and the third capacitor die 12, and the third capacitor die 12 is the upper capacitor die. Please note the number of the capacitor die 12' is for example, and it may be increased or decreased to enlarge or cut down the number of capacitors provided by the capacitor dies 12'. Specifically, for the first capacitor die 12', a hybrid bonding layer 19a is formed on the front side of the first capacitor die 12', a hybrid bonding layer 18a' is formed on the back side of the first capacitor die 12', and the hybrid bonding layer 19a is in contact with the hybrid bonding layer 18a of the IC die 10. For the second capacitor die 12', a hybrid bonding layer 19a' is formed on the front side of the second capacitor die 12', a hybrid bonding layer 18a" is formed on the back side of the second capacitor die 12', and the hybrid bonding layer 19a' is in contact with the hybrid bonding layer 18a' of the first capacitor die 12'. For the third capacitor die 12, a hybrid bonding layer 19a" is formed on the front side of the third capacitor die 12, and the hybrid bonding layer 19a" is in contact with the hybrid bonding layer 18a" of the second capacitor die 12'. Accordingly, the front side of the capacitor die 12' may face the front side of the IC die 10, and the back side of the capacitor die 12' may face the front side of the capacitor die 12. To transmit signals and power between the capacitor die 12 and the IC die 10, a plurality of conductive vias 29 and a plurality of third conductive pads 30 are formed. An end of the conductive vias 29 may in contact with one of electrodes 20-2 of the capacitors 131-1, 131-2 and another end of conductive vias 29 may in contact with at least one of the third conductive pads 30 at the back side of the capacitor die 12'. The third conductive pads 30 may in contact with second conductive pads 19-1, 19-2 at the front side of the other capacitor die 12' or the capacitor die 12 in one-on-one manner. In some embodiments, the third conductive pads may in contact with other second conductive pads which transmit data stored or for storing in the memory or apply internal reference voltages.

Figure 12:
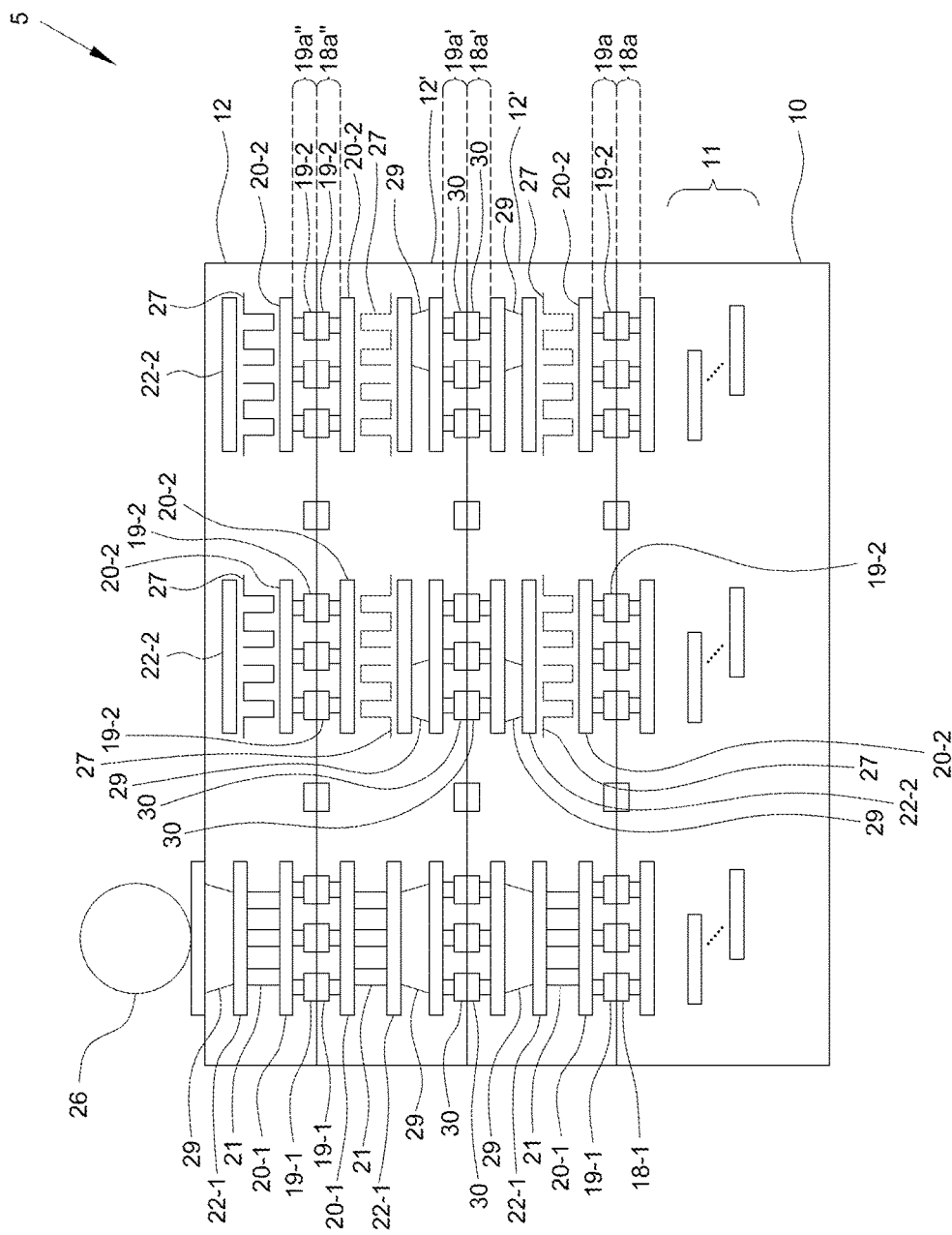
FIG. 12 shows a schematic diagram of a cross-sectional view of a circuit assembly according to a sixth embodiment of the invention.

FIG. 12 shows a schematic diagram of a cross-sectional view of a circuit assembly according to a sixth embodiment of the invention. Similar to the fifth embodiment, a stack of capacitor dies 12' in which a plurality of conductive vias 29 and a plurality of third conductive pads 30 are formed are stacked between a capacitor die 12 and an IC die 10 in a circuit assembly 5 of the present embodiment. In this embodiment, the first capacitor die 12' is the lower capacitor die in contact with the IC die 10, the second capacitor die 12' is the middle capacitor die disposed between the lower capacitor die and the third capacitor die 12, and the third capacitor die 12 is the upper capacitor die. Specifically, for the first capacitor die 12', a hybrid bonding layer 19a is formed on the front side of the first capacitor die 12', a hybrid bonding layer 18a' is formed on the back side of the first capacitor die 12', and the hybrid bonding layer 19a is in contact with the hybrid bonding layer 18a of the IC die 10. For the second capacitor die 12', a hybrid bonding layer 19a' is formed on the back side of the second capacitor die 12', a hybrid bonding layer 18a" is formed on the front side of the second capacitor die 12', and the hybrid bonding layer 19a' is in contact with the hybrid bonding layer 18a' of the first capacitor die 12'. For the third capacitor die 12, a hybrid bonding layer 19a" is formed on the front side of the third capacitor die 12, and the hybrid bonding layer 19a" is in contact with the hybrid bonding layer 18a" of the second capacitor die 12'. Compared with the second capacitor die 12' of the assembly circuit 4, the second capacitor die 12' in the assembly circuit 5 is upside down. Accordingly, for the assembly circuit 5, the back side of the second capacitor die 12' may face the back side of the first capacitor 12', and the front side of the second capacitor die 12' may face the front side of the third capacitor die 12. In some embodiments involving more than two additional capacitor dies, the arrangement of a front side of these capacitor dies may be alternately changed to face either a front side of the IC die or a front side of the capacitor die.

Figure 13:
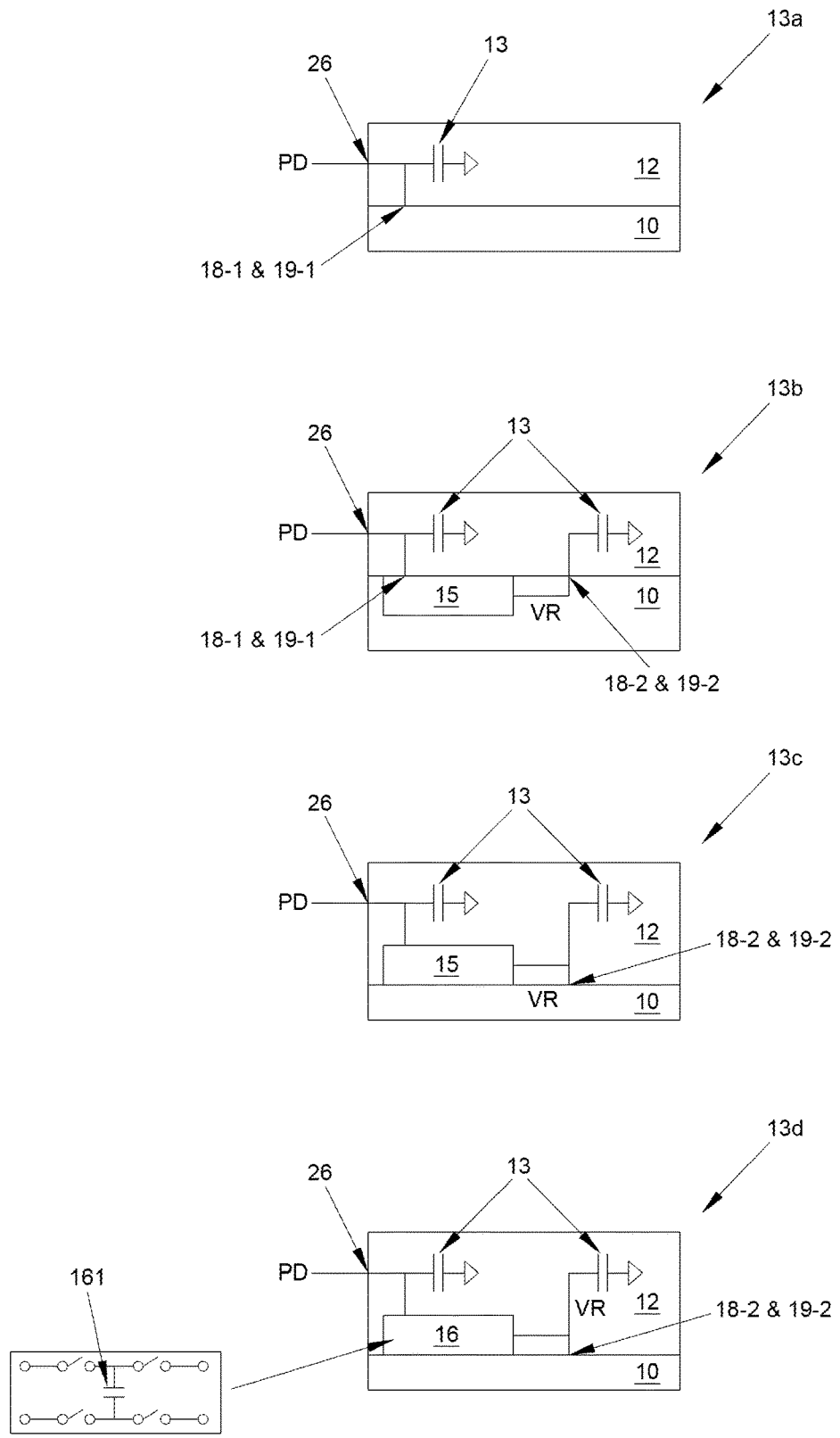
FIG. 13 shows various circuit assemblies according to some embodiments of the present invention.

FIG. 13 shows various circuit assemblies 13a, 13b, 13c, and 13d according to some embodiments of the present invention. The circuit assembly 13a may be the circuit assembly 1a as shown in FIG. 1. In the circuit assembly 13a, the capacitor block 13 is configured to be a decoupling capacitor for the external supply power PD of the IC die 10, wherein the external supply power PD may be generated by a DC-DC converter (not shown) external to the circuit assembly 13a, and the external supply power PD may be transmitted to the circuit assembly 13a through a power distribution circuit (not shown). In this embodiment, the external supply power PD is inputted to the circuit assembly 13a through the interface bump 26 and the related components (e.g. 20-1, 21, 22-1, 23, 24, 25) connected to the interface bump 26. Then, the external supply power PD is transmitted to the IC die 10 via the conductive pads 18-1 and 19-1.

The circuit assembly 13b may be the circuit assembly 2 as shown in FIG. 3. In the circuit assembly 13b, the voltage regulator 15 is disposed in the IC die 10 for generating a regulated voltage VR according to an external supply voltage PD. The capacitor block 13 is configured to be a decoupling capacitor (e.g. 131-1) for the external supply power PD and configured to be the loading capacitor (e.g. 131-2) at the output terminal of the voltage regulator 15, wherein the external supply power PD may be transmitted to the voltage regulator 15 in the IC die 10 through the interface bump 26 and the related components (e.g. 20-1, 21, 22-1, 23, 24, 25, 18-1 and 19-1) connected to the interface bump 26. The capacitor block 13 is coupled to the output terminal of the voltage regulator 15 via the conductive pads 18-2 and 19-2.

The circuit assembly 13c may be the circuit assembly 1b as shown in FIG. 2. In the circuit assembly 13c, the voltage regulator 15 is disposed in the capacitor die 12 for generating a regulated voltage VR according to an external supply voltage PD. The capacitor block 13 is configured to be a decoupling capacitor (e.g. 131-1) for the external supply power PD and configured to be the loading capacitor (e.g. 131-2) at the output terminal of the voltage regulator 15, wherein the external supply power PD may be transmitted to the voltage regulator 15 in the capacitor die 12 through the interface bump 26 and the related components (e.g. 20-1, 21, 22-1, 23, 24, 25) connected to the interface bump 26. The capacitor block 13 is coupled to the output terminal of the voltage regulator 15. The regulated voltage VR is transmitted to the IC die 10 via the conductive pads 18-2 and 19-2.

The circuit assembly 13d may be the circuit assembly 1b as shown in FIG. 2. In the circuit assembly 13d, the switched capacitor type voltage regulator 16 is disposed in the capacitor die 12 for generating a regulated voltage VR according to an external supply voltage PD. The capacitor block 13 is configured to be a decoupling capacitor (e.g. 131-1) for the external supply power PD and configured to be the loading capacitors (e.g. 131-2) at the output terminal of the switched capacitor type voltage regulator 16, wherein the external supply power PD may be transmitted to the switched capacitor type voltage regulator 16 in the capacitor die 12 through the interface bump 26 and the related components (e.g. 20-1, 21, 22-1, 23, 24, 25) connected to the interface bump 26. The capacitor block 13 is coupled to the output terminal of the switched capacitor type voltage regulator 16. The regulated voltage VR is transmitted to the IC die 10 via the conductive pads 18-2 and 19-2. Moreover, the capacitor block 13 is configured to be the flying capacitor 161 (e.g. 131-3) in each unit cell of the switched capacitor type voltage regulator 16, wherein the first electrode of the flying capacitor 161 is coupled to two switches, and the second electrode of the flying capacitor 161 is coupled to another two switches. The switches are controlled to change the topology of the switched capacitor type voltage regulator 16 for generating the regulated voltage VR. The detailed operation of the switched capacitor type voltage regulator 16 is omitted here for brevity.

Figure 14:
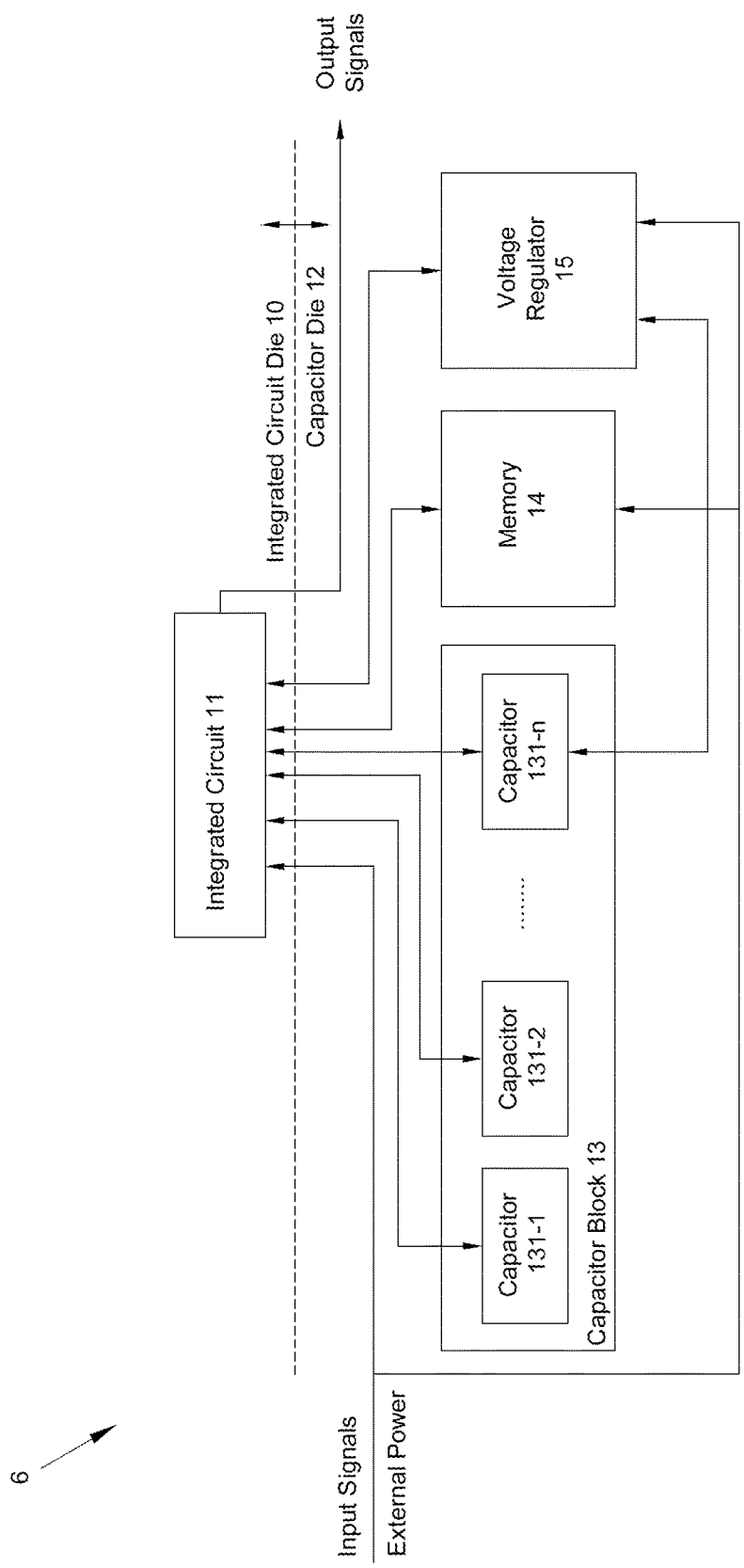
FIG. 14 shows an example block diagram of a circuit assembly according to a seventh embodiment of the present invention.

FIG. 14 shows an exemplary block diagram of a circuit assembly 6 according to a seventh embodiment of the present invention. For brevity, the circuit assembly 6 may be the block diagram of the circuit assembly 1a in combination with the circuit assembly 1b. Therefore, the circuit assembly 6 may comprise the IC die 10 comprising the IC 11 and the capacitor die 12 comprising the capacitor block 13 constructed by the plurality of capacitors 131-1, 131-2, 131-n, and optionally the memory 14 for data storage and the voltage regulator 15 for providing internal supply power for the IC die 10. The IC die 10 may provide a plurality of first conductive pads at least one of which electrically connected to the IC 11 and the capacitor die 12 may provide a plurality of second conductive pads and a plurality of conductive vias. The IC die 10 may be stacked with the capacitor die 12 in such a way that the first conductive pads electrically connect to the second conductive pads to transmit signals and deliver external/internal supply power between the IC die 10 and the capacitor die 12 so that the IC 11 is powered and receives input signals to operate with the capacitors 131-1, 131-2, 131-n and the memory 14 in the capacitor die 12 to generate output signals. Preferably, wire bonding or soldering mounting is not involved in the electrical connection between the first and second conductive pads. The signals, input signals and output signals may be electrical characters, such as voltage, current, wave, pulse, etc. in the form of AC or DC from either an internal or external circuit or device. The function and structure of the IC 11 may not be limited to a certain category, but may be varied to meet a specific application. For example, the IC 11 may be a digital IC of a processor comprising CPU (Central Processing Unit), GPU (Graphic Processing Unit), MPU (Micro Processing Unit), DSP (Digital Signal Processor), FPGA (Field Programmable Gate Array), ASIC (Application Specific Integrated Circuit), SoC (System on Chip), etc.

The electrically connection between the first and second conductive pads of the IC die 10 and the capacitor die 12 may be built up by physical contact and may be customized to change the circuit layout, such as the connection of each capacitors 131-1, 131-2, 131-n. Specifically, the input and output of the IC die 10 may count on the capacitor die 12. For example, the input signals and the external power may be input to the IC die 10 through the capacitor die 12, and then the output signals of the IC die 10 may be transmitted to the capacitor die 12.

In the present embodiment, the capacitors 131-1, 131-2, 131-n are in the form of integrated passive device (IPD) which may be manufactured in current integrated circuit processes without additional fabrication steps and present extremely low ESL (Equivalent Series Inductance) and ESR (Equivalent Series Resistance) both of which may be as small as possible, and preferably, the structure of the capacitors 131-1, 131-2, 131-n may be for instance but are not limited to planar capacitors, stacked capacitors, multi-fin capacitors, cylinder capacitors, trench capacitors, deep trench capacitors, substrate-plate capacitors, etc. The materials, shapes, sizes of each part, portion or layer of the capacitors 131-1, 131-2, 131-n may be varied due to various considerations. Therefore, the capacitance of the capacitors 131-1, 131-2, 131-n may be tailored to meet desired application; for example, the sizes of the capacitors 131-1, 131-2, 131-n may be great to present high capacitance which may be as large as possible. The amount of the capacitors 131-1, 131-2, 131-n may be not limited to a certain value or range, and preferably, it may be massive to support high performance computing of the IC die 10 which power consumption may be great then. For example, with the capacitors 131-1, 131-2, 131-n scaling, the capacitance density may be significantly high; preferably, the capacitance density of the capacitors 131-1, 131-2, 131-n may be more than 0.1 $\mu F/mm^2$, and more preferably, more than 1 $\mu F/mm^2$. At least one of the capacitors 131-1, 131-2, 131-n, such as the capacitors 131-1, 131-2, may electrically connect to the IC die 10 as decoupling capacitors to reduce power supply fluctuation due to power distortion and noise or as flying capacitor of a convertor providing an internal power to promote efficiency. In the present embodiment, the decoupling capacitor may be used for decoupling AC signals from DC signals or vice versa to protect the IC 11 of the IC die 10.

Figure 15:
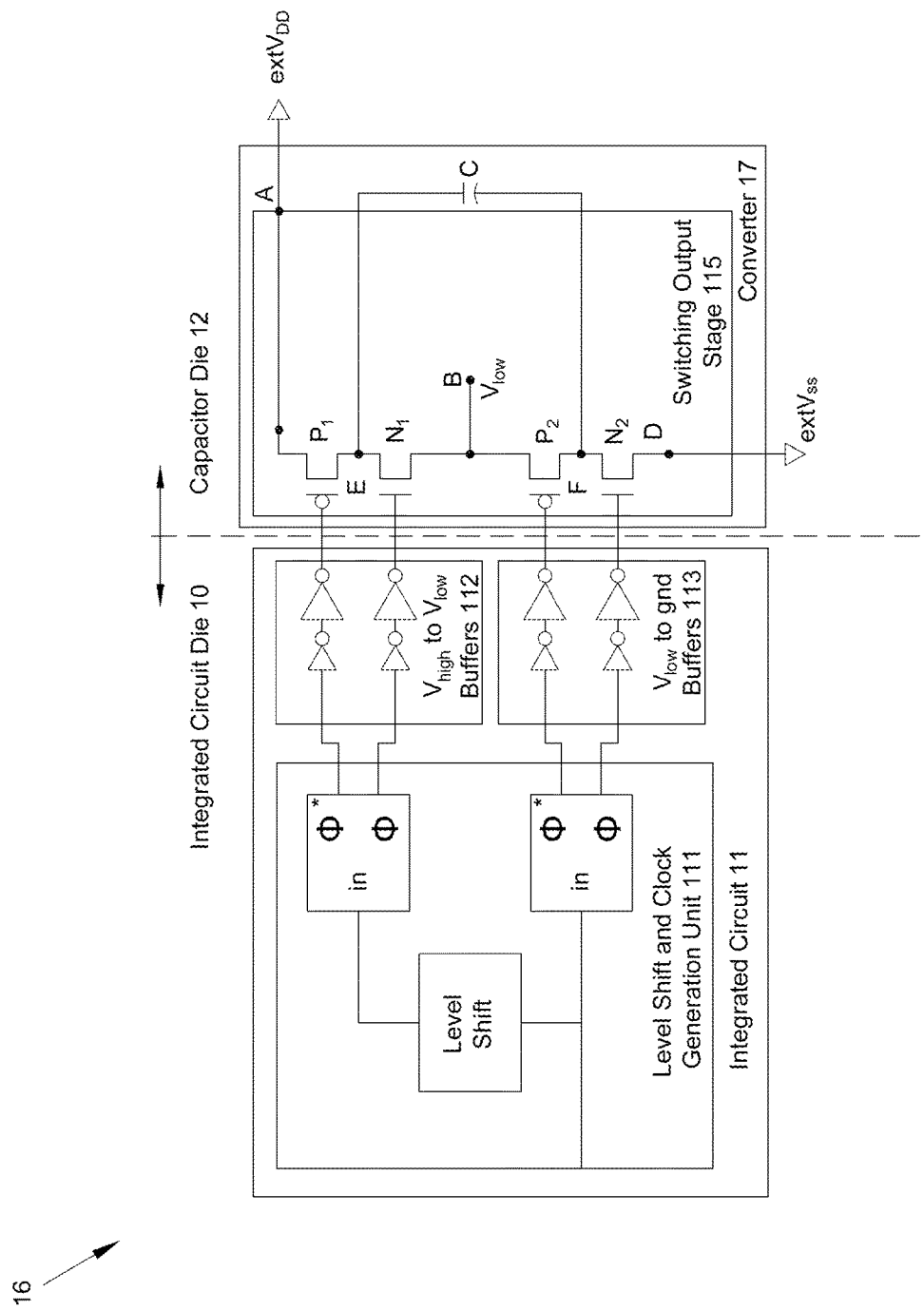
FIG. 15 shows a block diagram of a switched capacitor type voltage regulator provided in a circuit assembly according to an embodiment of the invention.

FIG. 15 shows a block diagram of a switched capacitor type voltage regulator 16 provided in a circuit assembly (e.g. the circuit assembly 1b, the circuit assembly 2, or the circuit assembly 1b in combination with the circuit assembly 2) according to an embodiment of the invention. The exemplary switched capacitor type voltage regulator 16 may be an implementation of the voltage regulator 15. The structure of the exemplary switched capacitor type voltage regulator 16 may be modified to meet specific requirements for application. For example, multiple switched capacitor type voltage regulators as an internal power supply controlled by multiple phase clocks may be arranged to output a plurality of voltages which may be optimized for a plurality of CPUs (Central Processing Units) or GPUs (Graphics Processing Unit). Here, an exemplary switched capacitor type voltage regulator 16 may be constructed together by the IC die 10 and the capacitor die 12. The switched capacitor type voltage regulator 16 may comprise a level shift and clock generation unit 111, $V_{high}$ to $V_{low}$ buffers 112, $V_{low}$ to ground buffers 113 and a converter 17. Specifically, each of the level shift and clock generation unit 111, $V_{high}$ to $V_{low}$ buffers 112, $V_{low}$ to ground buffers 113 may be formed by the IC 11, and the converter 17 may be built up by the switching output stage 115 along with a flying capacitor C which may be at least one of the capacitors 131-1, 131-2, 131-n, such as the capacitor 131-n. The level shift and clock generation unit 111 may provide clock signals in the $V_{high}$ to $V_{low}$ and $V_{low}$ to ground domain. The $V_{high}$ to $V_{low}$ buffers 112 and $V_{low}$ to ground buffers 113 may comprise a plurality of operational amplifiers to transfer the output from the level shift and clock generation unit 111 with a high impedance to the converter 17 with a low impedance. The switching output stage 115 may be a power driver comprising two PMOS transistors $P_1$, $P_2$ and two NMOS transistors $N_1$, $N_2$ alternately serially connecting to the PMOS transistors $P_1$, $P_2$. Here the switched capacitor type voltage regulator 16 is provided for 2:1 conversion, and the electrically connection between the first and second conductive pads of the IC die 10 and the capacitor die 12 may be varied to change the conversion ratio of the exemplary switched capacitor type voltage regulator 16. In the present example, the converter 17 may typically operate in two phases, during each of which, such as phase $\varphi^*$ and phase $\varphi$, the PMOS transistors $P_1$, $P_2$ and the NMOS transistors $N_1$, $N_2$ may be alternately turn-on and turn-off to charge or discharge the flying capacitor C, and then an internal power $V_{low}$ may be provided to the IC die 10 and/or the capacitor die 12. The output current of the switched capacitor type voltage regulator 16 may be very high because the flying capacitor C is close to the IC die 10 with many connections between the IC die 10 and the capacitor die 12 reducing ESR/ESL. In some embodiments, more than two switched capacitor type voltage regulators may be provided by a circuit assembly for fine-grain domain control, and the output voltage of the internal power may be changed by an additional register of the IC 11 which may be a processor, such as CPU or GPU offering power settings. Because the capacitors 131-1, 131-2, 131-*n* are IPD, they are able to present significantly high capacitance density and low series resistance, enabling the switched capacitor type voltage regulator 16 to support high output power.

In the embodiment shown in the above FIG. 2, the left second conductive pad 19-1 receiving an external high reference voltage extV$_{DD}$ may be indicated as an end A of the switched capacitor type voltage regulator 16 (shown in FIG. 15) driving the switched capacitor type voltage regulator 16, the right the second conductive pads 19-1 receiving an external low reference voltage extV$_{SS}$ may electrically connect to the right second conductive pad 19-4 and may be indicated as an end D of the switched capacitor type voltage regulator 16 (shown in FIG. 15) to provide an internal low reference voltage V$_{SS}$, and the left second conductive pad 19-4 indicated as an end B of the switched capacitor type voltage regulator 16 (shown in FIG. 15) may receive the internal power V$_{low}$ output from the switched capacitor type voltage regulator 16 as an internal high reference voltage V$_{DD}$.

Please refer to FIG. 3 again, in the circuit assembly 2 of the present embodiment, the IC die 10 together with the capacitor die 12 may construct a switched capacitor type voltage regulator, such as the switched capacitor type voltage regulator 16 shown in FIG. 15. Referring to both FIGS. 3 and 15, the left second conductive pad 19-1 receiving an external high reference voltage extV$_{DD}$ may be indicated as the end A of the switched capacitor type voltage regulator 16 driving the switched capacitor type voltage regulator 16, the right second conductive pads 19-1 receiving an external low reference voltage extV$_{SS}$ may be indicated as the end D of the switched capacitor type voltage regulator 16, and a flying capacitor may be provided to the switched capacitor type voltage regulator by the electrically connection between the right first and second conductive pads 18-2, 19-2 (corresponding to an end E of the switched capacitor type voltage regulator 16) and the left first and second conductive pad 18-2, 19-2 (corresponding to an end F of the switched capacitor type voltage regulator 16).

Figure 16:
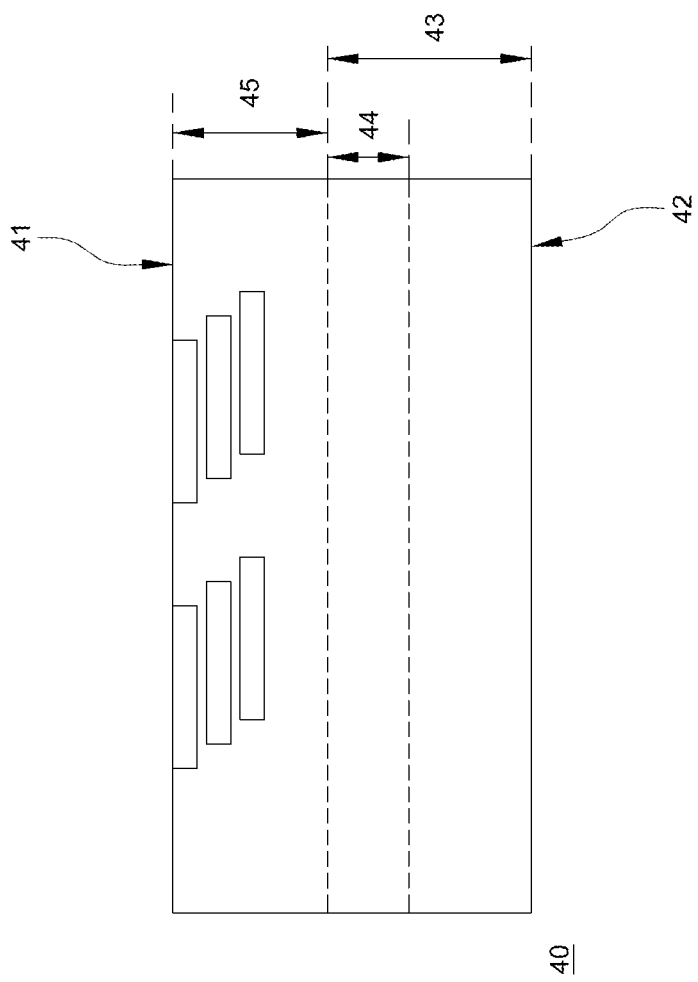
FIG. 16 shows a definition of a front side and a back side of a semiconductor structure according to an embodiment of the invention.

FIG. 16 shows a definition of a front side 41 and a back side 42 of a semiconductor structure 40 such as a semiconductor substrate or a semiconductor wafer. The semiconductor structure 40 (e.g. the active die 10 or the capacitor die 12 as shown in FIG. 1) may comprise a semiconductor substrate 43 and a back-end-of-line (BEOL) structure 45, in which a front-end-of-line (FEOL) structure 43 is formed in/on the semiconductor structure 43. According to the embodiments, the surface of the BEOL structure 45 may be the front side 41 of the semiconductor structure 40, and the surface of the semiconductor substrate 43 may be the back side 42 of the semiconductor structure 40. However, this is not a limitation of the present embodiments. The definition of the front side and the back side of a semiconductor structure may be switched.

Therefore, compared with one of conventional technologies, the novel and comparatively simple structure of a circuit assembly may integrate both capacitors and an integrated circuit allowing the integrated circuit being powered and receiving signals to operate with the capacitors through electrical connections between conductive pads between dies. With the circuit assembly, an integrated circuit may be provided with numerous of IPD capacitors as one of decoupling capacitors, flying capacitor of a convertor serving an internal power, etc. with high capacitance value and/or excellent ESR/ESL to achieve high performance computing but avoiding from wire bonding or solder mounting.

While various embodiments in accordance with the disclosed principles are described above, it should be understood that they are presented by way of example only, and are not limiting. Thus, the breadth and scope of example embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A circuit assembly, comprising:
    an integrated circuit (IC) die having a first hybrid bonding layer; and
    a capacitor die stacked with the IC die, configured to include a capacitor coupled to the IC die, and having a second hybrid bonding layer in contact with the first hybrid bonding layer;
    wherein the IC die is electrically coupled to the capacitor die through the first hybrid bonding layer and the second hybrid bonding layer, the capacitor die has a first side and a second side that is opposite to the first side, the second hybrid bonding layer is formed on the second side, a plurality of conductive vias are formed on the first side, and the capacitor die further comprises a plurality of interface bumps electrically connecting to the conductive vias.

2. The circuit assembly according to claim 1, wherein the capacitor die comprises a deep trench capacitor in a semiconductor substrate of the capacitor die, or a metal-insulator-metal (MIM) stack capacitor in a plurality of interconnect conductive layers of the capacitor die, or a capacitor in a form of an integrated passive device (IPD), or a capacitor of a memory cell.

3. The circuit assembly according to claim 1, wherein the capacitor die further comprises a plurality of memory cells electrically connecting to the IC die through the first hybrid bonding layer and the second hybrid bonding layer.

4. The circuit assembly according to claim 1, further comprising a heatsink attached to a surface of the IC die.

5. The circuit assembly according to claim 1, wherein the first hybrid bonding layer is at a front side of the IC die, and the second hybrid bonding layer is at a front side or a back side of the capacitor die.

6. A wafer-on-wafer assembly, comprising:
a first wafer, having a plurality of integrated circuits (ICs) and a first hybrid bonding layer; and
a second wafer, having a plurality of capacitors and a second hybrid bonding layer in contact with the first hybrid bonding layer, the second wafer further defining a plurality of keep-out-zones therein;
wherein a first portion of at least one IC is stacked with the plurality of capacitors for coupling at least one capacitor to the at least one IC through the first hybrid bonding layer and the second hybrid bonding layer, and a second portion of the at least one IC is coupled to the plurality of keep-out-zones through the first hybrid bonding layer and the second hybrid bonding layer.

7. The wafer-on-wafer assembly according to claim 6, wherein the second portion of the at least one IC is arranged to receive external signal through the plurality of keep-out-zones or to transmit signal to external through the plurality of keep-out-zones.

8. The wafer-on-wafer assembly according to claim 6, wherein the plurality of keep-out-zones of the second wafer are mapped to the second portions of ICs of the first wafer.

9. The wafer-on-wafer assembly according to claim 6, the plurality of keep-out-zones are arranged to form at least one conductive via to connect external signal to the plurality of ICs in the first wafer.

10. The wafer-on-wafer assembly according to claim 6, wherein at least one of the plurality of capacitors comprises a deep trench capacitor in a semiconductor substrate of the second wafer, or a metal-insulator-metal (MIM) stack capacitor in a plurality of interconnect conductive layers of the second wafer, or a capacitor in a form of an integrated passive device (IPD), or a capacitor of a memory cell.

11. The wafer-on-wafer assembly according to claim 6, further comprising a plurality of external signal connections at a back side of the second wafer, the plurality of external signal connections are formed at the plurality of keep-out-zones.

12. The wafer-on-wafer assembly according to claim 11, wherein at least one of the external signal connections of the capacitor die comprises a plurality of through silicon vias (TSV).

13. The wafer-on-wafer assembly according to claim 12, wherein one of the TSVs extends from the back side of the second wafer to a metal layer in a plurality of interconnect conductive layers of one of the first wafer and the second wafer.

14. The wafer-on-wafer assembly according to claim 11, further comprising at least one voltage regulator providing regulated voltage based on external supply power obtained from at least one of the external signal connections, wherein the at least one voltage regulator is in the first wafer, the second wafer, or combination thereof.

15. The wafer-on-wafer assembly according to claim 6, wherein the second wafer further comprises a plurality of memory cells electrically connecting to the first wafer through the first hybrid bonding layer and the second hybrid bonding layer.

16. A circuit assembly, comprising:
an integrated circuit (IC) die having a first hybrid bonding layer; and
a capacitor die stacked with the IC die, configured to include a capacitor coupled to the IC die, and having a second hybrid bonding layer in contact with the first hybrid bonding layer;
wherein the IC die is electrically coupled to the capacitor die through the first hybrid bonding layer and the second hybrid bonding layer, the capacitor die comprises a deep trench capacitor in a semiconductor substrate of the capacitor die, or a metal-insulator-metal (MIM) stack capacitor in a plurality of interconnect conductive layers of the capacitor die; and
the circuit assembly further comprises:
external signal connections at a back side of the capacitor die, each of the external signal connections forming a keep-out zone for the deep trench capacitor or the MIM stack capacitor.

17. The circuit assembly according to claim 16, wherein the external signal connections of the capacitor die comprises a plurality of through silicon vias (TSV).

18. The circuit assembly according to claim 17, wherein one of the TSVs extends from the back side of the capacitor die to a metal layer in a plurality of interconnect conductive layers of one of the IC die and the capacitor die.

19. The circuit assembly according to claim 16, further comprising a voltage regulator providing regulated voltage based on external supply power obtained from the external signal connections, wherein the voltage regulator is in the IC die, the capacitor die, or combination thereof.

* * * * *